United States Patent
Chann et al.

(10) Patent No.: US 8,559,107 B2
(45) Date of Patent: Oct. 15, 2013

(54) SCALABLE WAVELENGTH BEAM COMBINING SYSTEM AND METHOD

(75) Inventors: Bien Chann, Merrimack, NH (US); Robin Huang, North Billerica, MA (US)

(73) Assignee: Teradiode, Inc., Wilmington, MA (US)

( * ) Notice: Subject to any disclaimer, the term of this patent is extended or adjusted under 35 U.S.C. 154(b) by 98 days.

(21) Appl. No.: 13/042,243

(22) Filed: Mar. 7, 2011

(65) Prior Publication Data
US 2011/0216792 A1 Sep. 8, 2011

Related U.S. Application Data

(60) Provisional application No. 61/310,777, filed on Mar. 5, 2010, provisional application No. 61/310,781, filed on Mar. 5, 2010, provisional application No. 61/417,394, filed on Nov. 26, 2010.

(51) Int. Cl.
G02B 27/64 (2006.01)

(52) U.S. Cl.
USPC .......................................................... 359/556

(58) Field of Classification Search
USPC .......................................................... 359/556
See application file for complete search history.

(56) References Cited

U.S. PATENT DOCUMENTS

| | | | |
|---|---|---|---|
| 6,044,096 A | 3/2000 | Wolak et al. | |
| 6,192,062 B1 | 2/2001 | Sanchez-Rubio et al. | |
| 6,327,292 B1 * | 12/2001 | Sanchez-Rubio et al. | 372/92 |
| 6,356,576 B1 | 3/2002 | Smith | |
| 8,049,966 B2 | 11/2011 | Chann | |
| 2004/0095983 A1 | 5/2004 | Whitley | |
| 2006/0109876 A1 | 5/2006 | Donoghue et al. | |
| 2007/0002925 A1 | 1/2007 | Zediker | |
| 2007/0127123 A1 * | 6/2007 | Brown et al. | 359/556 |

* cited by examiner

*Primary Examiner* — James Jones
(74) *Attorney, Agent, or Firm* — Ascentage Law, PLLC

(57) ABSTRACT

Systems and methods have been provided to increase output power, as well as spatial and/or spectral brightness when utilizing or combining a plurality of laser elements.

6 Claims, 13 Drawing Sheets

SCALABLE WAVELENGTH BEAM COMBINING SYSTEM AND METHOD

CROSS-REFERENCE TO RELATED APPLICATIONS

This application claims the benefit of the following provisional applications, each of which are hereby incorporated by reference in its entirety: U.S. Ser. No. 61/310,777 filed Mar. 5, 2010; U.S. Ser. No. 61/310,781 filed Mar. 5, 2010, and U.S. Ser. No. 61/417,394 filed Nov. 26, 2010.

BACKGROUND OF THE INVENTION

1. Field of the Invention

The present embodiments relate generally to laser systems and more particularly to wavelength beam combining systems and methods.

2. Description of the Prior Art

Wavelength beam combining (WBC) is a method for scaling the output power and brightness from diode bars and stacks.

WBC methods have been developed to combine beams along the slow dimension of each emitter as well as the fast dimension of each emitter. See for example U.S. Pat. Nos. 6,192,062, 6,208,679 and 2010/0110556 A1. However, the traditional methods described therein do not allow for greater flexibility in scaling the overall footprint of the system and flexibility in addressing large aperture optic concerns while scaling the output power and brightness to produce kilowatts, tens and hundreds of kilowatts, and even megawatts of power. Improved methods and systems to increased spectral brightness and output power methods to meet various industrial, scientific and defense applications are needed.

The following application seeks to solve the problems stated.

SUMMARY OF THE INVENTION

Lasers have numerous industrial, scientific, and defense applications. Industrial applications include metal cutting, spot welding, seam welding, drilling, fine cutting, and marking. Scientific applications include laser-guide stars for astronomy, gravitational wave detection, laser cooling and trapping, and laser-based particle accelerator. Defense applications include the laser-based weapon, the laser-induced spark, and LIDAR.

Example lasers that are applicable as described above include high average and high peak power fiber lasers and amplifiers, high average and peak power eye-safe Erbium-doped (Er-doped) fiber lasers and amplifiers, quasi-continuous wave (QCW) or pulsed or long-pulsed operation of industrial lasers, short pulsed (pulse widths of a few ns to hundreds of ns) operation of industrial lasers, and the like.

When wavelength beam combining is applied to any of the lasers described herein, including the lasers that are applicable as described above many of the relevant factors that impact laser utilization can be substantially improved. Aspects such as power output can be significantly increased, brightness can be substantially improved, cost can be dramatically reduced, thermal and fiber-related optics challenges can be readily overcome or mitigated to the point of insignificance, overall size can be reduced, and the like. Results of these and other factors may be improved by two or more orders of magnitude with wavelength beam combining.

Lasers

A laser, such as a laser described in the following general description may be used in association with embodiments of the innovations described herein.

Lasers may generally be defined as devices that generate visible or invisible light through stimulated emission of light. "Laser" originally was an acronym for "Light Amplification by Stimulated Emission of Radiation", coined in 1957 by the laser pioneer Gordon Gould, but is generally now mostly used for devices that produce light using the laser principle.

Lasers generally have properties that make them useful in a variety of applications. Laser properties may include: emitting light as a laser beam which can propagate over long lengths without much divergence and can be focused to very small spots; a very narrow bandwidth as compared to most other light sources which produce a very broad spectrum; light can be emitted continuously, or in short bursts (pulses) that may be as short as a few femto-seconds.

Lasers may come in a variety of types. Common laser types include semiconductor lasers, solid-state lasers, fiber lasers, and gas lasers.

Semiconductor lasers (mostly laser diodes) may be electrically or optically pumped and generally efficiently generate very high output powers often at the expense of poor beam quality. Semiconductor lasers may produce low power with good spatial properties for application in CD and DVD players. Yet other semiconductor lasers may be suitable for producing high pulse rate, low power pulses (e.g. for telecom applications). Special types of semiconductor lasers include quantum cascade lasers (for mid-infrared light) and surface-emitting semiconductor lasers (VCSELs and VECSELs), the latter also being suitable for pulse generation with high powers. Semiconductor lasers are further described elsewhere herein under the heading "LASER DIODE"

Solid-state lasers may be based on ion-doped crystals or glasses (e.g. doped insulator lasers) and may pumped with discharge lamps or laser diodes for generating high output power. Alternatively solid-state lasers may produce low power output with very high beam quality, spectral purity and/or stability (e.g. for measurement purposes). Some solid-state lasers may produce ultra short pulses with picosecond or femtosecond durations. Common gain media for use with solid state lasers include: Nd:YAG, Nd:YVO4, Nd:YLF, Nd:glass, Yb:YAG, Yb:glass, Ti:sapphire, Cr:YAG and Cr:LiSAF.

Fiber lasers may be based on optical glass fibers which are doped with some laser-active ions in the fiber core. Fiber lasers can achieve extremely high output powers (up to kilowatts) with high beam quality have limited wavelength-tuning operation. Narrow line width operation and the like may also be supported by fiber lasers.

Gas lasers may include helium-neon lasers, CO2 lasers, argon ion lasers, and the like may be based on gases which are typically excited with electrical discharges. Frequently used gases include CO2, argon, krypton, and gas mixtures such as helium-neon. In addition, excimer lasers may be based on any of ArF, KrF, XeF, and F2. Other less common laser types include: chemical and nuclear pumped lasers, free electron lasers, and X-ray lasers.

Laser Diode

A laser diode, such as a laser diode described in the following general description may be used in association with embodiments of the innovations described herein and in the exhibits referenced herein.

A laser diode is generally based around a simple diode structure that supports the emission of photons (light). However, to improve efficiency, power, beam quality, brightness, tunability, and the like, this simple structure is generally modified to provide a variety of many practical types of laser diodes. Laser diode types include small edge-emitting varieties that generate from a few milliwatts up to roughly half a watt of output power in a beam with high beam quality. Structural types of diode lasers include double hetero-structure lasers that include a layer of low bandgap material sandwiched between two high bandgap layers; quantum well lasers that include a very thin middle layer (quantum well layer) resulting in high efficiency and quantization of the laser's energy; multiple quantum well lasers that include more than one quantum well layer improve gain characteristics; quantum wire or quantum sea (dots) lasers replace the middle layer with a wire or dots that produce higher efficiency quantum well lasers; quantum cascade lasers that enable laser action at relatively long wavelengths which can be tuned by altering the thickness of the quantum layer; separate confinement heterostructure lasers, which are the most common commercial laser diode and include another two layers above and below the quantum well layer to efficiently confine the light produced; distributed feedback lasers, which are commonly used in demanding optical communication applications and include an integrated diffraction grating that facilitates generating a stable wavelength set during manufacturing by reflecting a single wavelength back to the gain region; vertical-cavity surface-emitting laser (VCSEL), which have a different structure that other laser diodes in that light is emitted from its surface rather than from its edge; vertical-external-cavity surface-emitting-laser (VECSELs) and external-cavity diode lasers, which are tunable lasers that use mainly double heterostructures diodes and include gratings or multiple-prism grating configurations. External-cavity diode lasers are often wavelength-tunable and exhibit a small emission line width. Laser diode types also include a variety of high power diode-based lasers including: broad area lasers that are characterized by multi-mode diodes with 1×100 um oblong output facets and generally have poor beam quality but generate a few watts of power; tapered lasers that are characterized by astigmatic mode diodes with 1×100 um tapered output facets that exhibit improved beam quality and brightness when compared to broad area lasers; ridge waveguide lasers that are characterized by elliptical mode diodes with 1×4 um oval output facets; and slab-coupled optical waveguide lasers (SCOWL) that are characterized by circular mode diodes with 4×4 um and larger output facets and can generate watt-level output in a diffraction-limited beam with nearly a circular profile. There are other types of diode lasers reported in addition to those described above.

Laser Diode Arrays, Bars and Stacks

Laser diode arrays, bars and/or stacks, such as those described in the following general description may be used in association with embodiments of the innovations described herein and in the exhibits referenced herein.

Laser diodes may be packaged individually or in groups, generally in one-dimensional rows/arrays (diode bar) or two dimensional arrays (diode-bar stack). A diode array stack is generally a vertical stack of diode bars. Laser diode bars or arrays generally achieve substantially higher power, and cost effectiveness than an equivalent single broad area diode. High-power diode bars generally contain an array of broad-area emitters, generating tens of watts with relatively poor beam quality and despite the higher power, the brightness is often lower than that of a broad area laser diode. High-power diode bars can be stacked to produce high-power stacked diode bars for generation of extremely high powers of hundreds or thousands of watts. Laser diode arrays can be configured to emit a beam into free space or into a fiber. Fiber-coupled diode-laser arrays can be conveniently used as a pumping source for fiber lasers and fiber amplifiers.

A diode-laser bar is a type of semiconductor laser containing a one-dimensional array of broad-area emitters or alternatively containing sub arrays containing 10-20 narrow stripe emitters. A broad-area diode bar typically contains 19-49 emitters, each being on the order of e.g. 1×100 µm wide. The beam quality along the 1-µm dimension or fast-axis is typically diffraction-limited. The beam quality along the 100-µm dimension or slow-axis or array dimension is typically many times diffraction-limited. Typically, a diode bar for commercial applications has a laser resonator length of the order of 1 to 4 mm, is about 10 mm wide and generates tens of watts of output power. Most diode bars operate in the wavelength region from 780 to 1070 nm, with the wavelengths of 808 nm (for pumping neodymium lasers) and 940 nm (for pumping Yb:YAG) being most prominent. The wavelength range of 915-976 nm is used for pumping erbium-doped or ytterbium-doped high-power fiber lasers and amplifiers.

A property of diode bars that are usually addressed is the output spatial beam profile. For most applications beam conditioning optics are needed. Significant efforts are therefore often required for conditioning the output of a diode bar or diode stack. Conditioning techniques include using aspherical lenses for collimating the beams while preserving the beam quality. Micro optic fast axis collimators are used to collimate the output beam along the fast-axis. Array of aspherical cylindrical lenses are often used for collimation of each laser element along the array or slow-axis. To achieve beams with approximately circular beam waist a special beam shaper for symmetrization of the beam quality of each diode bar or array can be applied. A degrading property of diode bars is the "smile"—a slight bend of the planar nature of the connected emitters. Smile errors can have detrimental effects on the ability to focus beams from diode bars. Another degrading property is collimation error of the slow and fast-axis. For example, a twisting of the fast-axis collimation lens results in an effective smile. This has detrimental effects on the ability to focus. In stack "pointing" error of each bar is the most dominant effect. Pointing error is a collimation error. This is the result of the array or bar that is offset from the fast-axis lens. An offset of 1 µm is the same as the whole array having a smile of 1 µm.

Diode bars and diode arrays overcome limitations of very broad single emitters, such as amplified spontaneous emission or parasitic lasing in the transverse direction or filament formation. Diode arrays can also be operated with a more stable mode profile, because each emitter produces its own beam. Techniques which exploit some degree of coherent coupling of neighbored emitters can result in better beam quality. Such techniques may be included in the fabrication of the diode bars while others may involve external cavities. Another benefit of diode arrays is that the array geometry makes diode bars and arrays very suitable for coherent or spectral beam combining to obtain a much higher beam quality.

In addition to raw bar or array offerings, diode arrays are available in fiber-coupled form because this often makes it much easier to utilize each emitter's output and to mount the diode bars so that cooling of the diodes occurs some distance from the place where the light is used. Usually, the light is coupled into a single multimode fiber, using either a simple fast-axis collimator and no beam conditioning in the slow-axis direction, or a more complex beam shaper to preserve the brightness better. It is also possible to launch the beamlets from the emitters into a fiber bundle (with one fiber per emitter).

Emission bandwidth of a diode bar or diode array is an important consideration for some applications. Optical feedback (e.g. from volume Bragg grating) can significantly improve wavelength tolerance and emission bandwidth. In addition, bandwidth and exact center wavelength can also be important for spectral beam combining.

A diode stack is simply an arrangement of multiple diode bars that can deliver very high output power. Also called diode laser stack, multi-bar module, or two-dimensional laser array, the most common diode stack arrangement is that of a vertical stack which is effectively a two-dimensional array of edge emitters. Such a stack can be fabricated by attaching diode bars to thin heat sinks and stacking these assemblies so as to obtain a periodic array of diode bars and heat sinks. There are also horizontal diode stacks, and two-dimensional stacks.

For the high beam quality, the diode bars generally should be as close to each other as possible. On the other hand, efficient cooling requires some minimum thickness of the heat sinks mounted between the bars. This tradeoff of diode bar spacing results in beam quality of a diode stack in the vertical direction (and subsequently its brightness) is much lower than that of a single diode bar. There are, however, several techniques for significantly mitigating this problem, e.g. by spatial interleaving of the outputs of different diode stacks, by polarization coupling, or by wavelength multiplexing. Various types of high-power beam shapers and related devices have been developed for such purposes. Diode stacks can provide extremely high output powers (e.g. hundreds or thousands of watts).

There are also horizontal diode stacks, where the diode bars are arranged side-by-side, leading to a long linear array of emitters. Such an arrangement is more easily cooled due to the naturally convective cooling that occurs between the vertically oriented diode bars, and may thus also allow for a higher output power per emitter. Generally, the number of diode bars in a horizontal stack (and thus the total output power) is more limited than in a vertical stack.

Diode bars and diode stacks can achieve very high power without significant cooling challenges by applying quasi-continuous-wave operation that includes generate pulses of a few hundred microseconds duration and a pulse repetition rate of some tens of hertz.

Wavelength Beam Combining

Technologies and embodiments of wavelength beam combining, such as those described in the following general description may be used in association with embodiments of the innovations described herein and in the exhibits referenced herein.

As the light emitted by a laser diode is linearly polarized, it is possible to combine the outputs of two diodes with a polarizing beam splitter, so that a beam with twice the power of a single diode but the same beam quality can be obtained (this is often referred to as polarization multiplexing). Alternatively, it is possible to spectrally combine the beams of laser diodes with slightly different wavelengths using dichroic mirrors. More systematic approaches of beam combining allow combining a larger numbers of emitters with a good output beam quality.

Beam combining is generally used for power scaling of laser sources by combining the outputs of multiple devices. The principle of beam combining can essentially be described as combining the outputs of multiple laser sources, often in the form of a laser array to obtain a single output beam. The application of a scalable beam-combining technology can produce a power-scalable laser source, even if the single lasers contributing to the combined beam are not scalable. Beam combining generally targets multiplying output power while preserving beam quality so that the brightness is increased (nearly) as much as the output power.

While there may be many different approaches for beam combining with increased brightness, all can be grouped into one of three categories: coherent, polarization, and wavelength beam combining. Coherent beam combining works with beams which are mutually coherent. In a simple example monochromatic beams with the same optical frequency can be combined. However, some schemes of coherent beam combination are much more sophisticated and therefore work with emissions occurring over multiple frequencies, with the emission spectra of all emitters being the same.

Polarization beam combining combines two linearly polarized beams with a polarizer (e.g., a thin-film polarizer). Of course, this method is not repeatable, since it generates an unpolarized output. Therefore, the method does not allow power scaling in a strict sense. Each of these three techniques can be applied to various laser sources, e.g., based on laser diodes (particularly diode bars) and fiber amplifiers, but also to high-power solid-state bulk lasers and VECSELs.

Wavelength beam combining (also called spectral beam combining or incoherent beam combining) does not require mutual coherence because it employs emitters with non-overlapping optical spectra whose beams are fed into a wavelength-sensitive beam combiner, such as a prism, a diffraction grating, a dichroic mirror, a volume Bragg grating, and the like to produce a wavelength combined beam. WBC inventions and implementations are described in detail in U.S. Pat. Nos. 6,192,062, 6,208,679 and US 2010/0110556 A1. Wavelength beam combining successfully achieves easier beam combining without any significant loss of beam quality. Wavelength beam combining is also more reliable than a single high power laser diode because the failure of one emitter simply reduces the output power accordingly.

The general principle of wavelength beam combining is to generate several laser diode beams with non-overlapping optical spectra and combine them at a wavelength-sensitive beam combiner so that subsequently all of the beams propagate in the same direction.

To combine many diode lasers and achieve good beam quality, laser diodes that are combined must each have an emission bandwidth which is only a small fraction of the gain bandwidth. Beam quality during wavelength beam combining is further affected by the angular dispersion of the beam combiner. Beam combiners with sufficiently strong dispersion and wavelength stable laser diodes go a long way toward achieving good beam quality during wavelength beam combining. Techniques for tuning laser diode wavelengths to facilitate wavelength beam combining, range from independently tuning each laser to a predetermined wavelength, to automatically adjusting each laser diode beam wavelength based on its spatial position relative to the combined beam path.

Wavelength beam combining may be used for power scaling. While a simple example of nearly unlimited power scaling would be to tile collimated beams from a large number of independently running adjacent lasers, even though the combined power increases in proportion to the number of lasers, the beam quality of the combined output decreases while the brightness will be at best only equivalent to a single laser. Typically the brightness of the system is much lower than a single element. Therefore one can see that power scaling methods which conserve the beam quality of the beam combining elements are highly desirable.

Wavelength beam combining may be applied to various types of laser diode configurations including diode bars, diode stacks, and the like. A diode bar is a one-dimensional array of broad area laser emitters that can be combined with various fiber and optical systems to produce one or more wavelength combined beams. Diode bars may include two to fifty or more laser emitters on one linear substrate. Diode stacks are essentially a two dimensional array of diode. Diode bars can be fabricated into diode stacks in vertical stacking or horizontal stacking arrangements.

The systems and methods described herein address scaling WBC methods to produce high brightness and power. Some of the embodiments described herein use a plurality of modular laser input devices with each device being comprised of a plurality of laser elements to form a scalable system. The scalability of using modular laser input devices allows for flexibility in adapting to higher or lower powers as needed, reducing the size of optics required and in some instances reducing the overall footprint of the system, which in turn creates a compact and robust system. This system is scalable to kilowatts, tens and hundreds of kilowatts, and even megawatts of power output and brightness.

DETAILED DESCRIPTION OF THE PREFERRED EMBODIMENT

Aspects and embodiments relate generally to the field of scaling laser sources to high-power and high-brightness using an external cavity and, more particularly, to methods and apparatus for external-cavity beam combining using both one-dimensional or two-dimensional laser sources. Aspects and embodiments further relate to high-power and/or high-brightness multi-wavelength external-cavity lasers that generate an overlapping or coaxial beam from ten to hundreds and even megawatts of output power.

In particular, aspects and embodiments are directed to a method and apparatus for combining individual laser emitters into modular units where a plurality of these modular units are all combined in a single system producing a single output profile that has been scaled in brightness and power. One advantage of the invention provided herein is a reduction in the size of optical elements required for scaling systems. Another advantage is that the overall footprint of the wavelength beam combining (WBC) system may be reduced in size.

Often times 'simplifying' an optical system is thought of in terms of reducing the number of optical elements present in a particular system. Increasing the number of optical elements seems to increase the complexity of the system or manufacturability of the system. However, some of the embodiments described herein increase the number of optical elements in a WBC system to achieve some of the advantages previously discussed, such as reducing the aperture of certain optical elements.

Figure 1A:
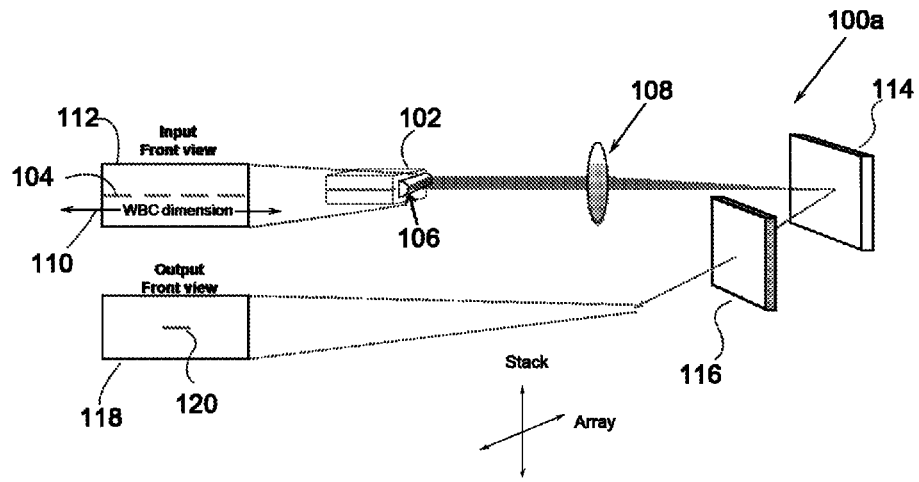
FIG. 1A is a schematic of a wavelength beam combining (WBC) method along the array dimension of a single diode laser bar of emitters.

For example, a basic WBC architecture is illustrated in FIG. 1a. An array 102 is shown having four laser elements; however, array 102 could have many more laser elements. Array 102 is shown as a single diode laser bar. However, it is anticipated an array or row of elements could be a fiber laser with multiple elements, multiple individual laser emitters aligned side by side, or any other combination of laser emitters arranged in a one-dimensional array where each emitter emits one or more electromagnetic beams and where the beam's slow diverging dimensions are aligned along the array or row dimension. Individual beams 104 are illustrated in the figures by a dash or single line, where the length or longer dimension of the beam represents the slow diverging dimension and the height or shorter dimension represents the fast diverging dimension. A single collimation optic 106 is used to collimate each beam along the fast dimension. Transform optic(s) 108, which could be a cylindrical or spherical lens or mirror or combination, is used to combine each beam 104 along the WBC dimension 110 as shown by the input front view 112. The transform optics 108 then overlaps the combined beam onto a dispersive element (shown using a diffraction grating) 114 where the combined beam is then transmitted as single output profile onto an output coupler 116. This output coupler then transmits the combined beams 120 as shown by the output front view 118. The output coupler is partially reflective and acts as a common front facet for all the laser elements in this external cavity system 100a. An external cavity is a lasing system where the secondary mirror is displaced at a distance away from the emission aperture or facet (not labeled) of each laser emitter. Generally, additional optics are placed between the emission aperture or facet and the output coupler or partially reflective surface.

Figure 1B:
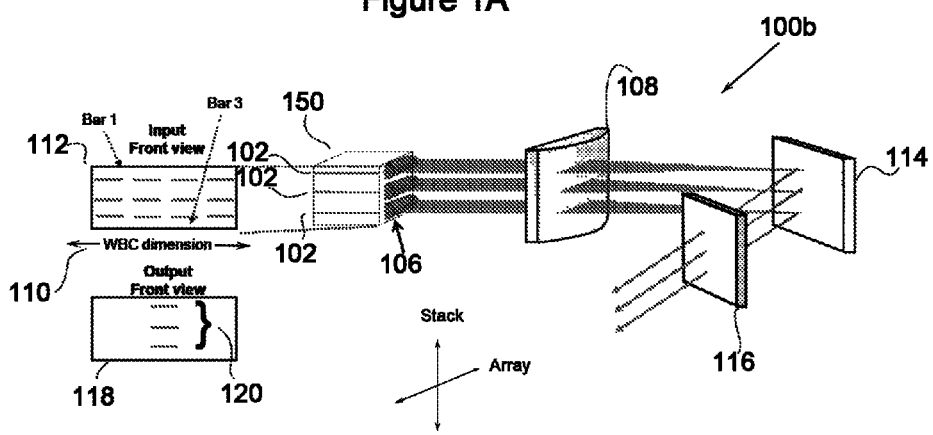
FIG. 1B is a schematic of a WBC method along the array dimension of a two-dimensional array of emitters.

Similarly, FIG. 1B illustrates a stack 150 of three laser arrays or bars 102 with each array having four emitters. As in FIG. 1A, the input front view 112 of FIG. 1B, which this time is a two-dimensional array of beams, is combined along the array dimension of the beams to produce the output front view 118 or single output profile 120 of a single column of beams.

Figure 1C:
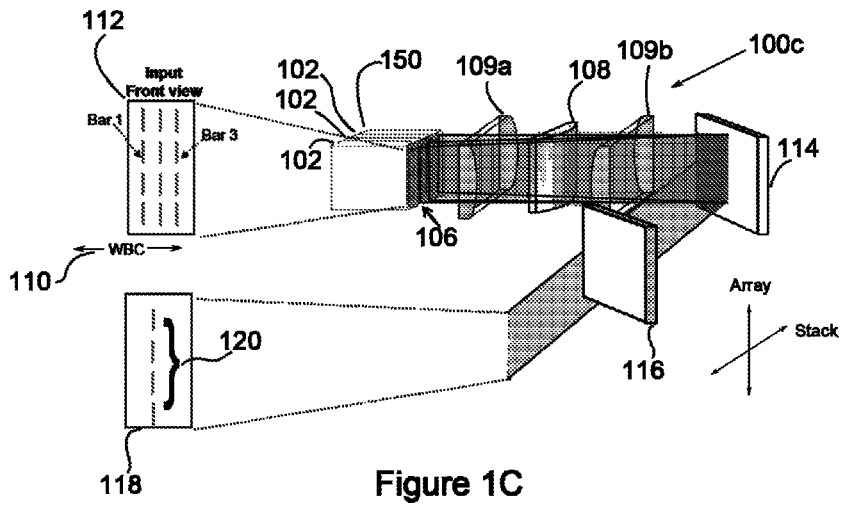
FIG. 1C is a schematic of a WBC method along the stack dimension of a two-dimensional array of emitters.

Another WBC method shown in FIG. 1C illustrates a stack 150 of laser arrays 102 forming a two-dimensional array of emitters where instead of combining the beams along the slow dimension as in FIGS. 1A-B, the WBC dimension 110 now follows along the stacking dimension of the beams arranged in a two-dimensional profile. The input front view 112 is now combined to produce the output front view 118 along the respective fast diverging dimension or axis wherein a single column of beams 120 is shown.

In the preceding illustrations of FIGS. 1A-C WBC methods utilizing single transform optical system were shown. The entire one-dimensional or two-dimensional input profile is reduced by a single transform optical system into a single output profile. However, as the number of beams increase along a single dimension such as the column or stacking dimension or the array or row dimension the size of the numerical aperture has to increase in size spatially to accept the entire one or two-dimensional profile. Additionally, if the spacing between emitters increases the numerical aperture of the transform would similarly need to increase in size to accept the more spread out or spatially distanced emitters. For example, a typical COTS diode stack has 2 mm pitch between the bars. Thus, if 100 bars are to be combined then the aperture of the transform optics has to be at least 200 mm. Most COTS optics have diameters less than 75 mm, with 25 mm being the most common.

This becomes problematic if one of the design goals of a WBC system is to produce a compact system that combines a large number of beams or the individual beams are spatially spread out. The increased number of beams or spatial spreading between beams creates a larger one-dimensional or two-dimensional beam profile. The transform optics thus need to have a sufficiently large aperture.

When the aperture of a transform optic becomes too large, manufacturing becomes more difficult and the optics cost generally increases. Making large aperture optics with low aberrations is a difficult task. Commercially-off-the-shelve optics with acceptable quality is limited to about 5 to 6 inches in diameter, with 1 inch being the most common.

Laser sources based on common "off-the-shelf" high power laser diode arrays and stacks are based on broad-area diode laser elements. Typically, the beam quality of these elements is diffraction-limited along the fast axis and many times diffraction-limited along the slow axis of the laser elements. It is to be appreciated that although the following discussion may refer primarily to laser diodes, diode bars and diode stacks, embodiments of the invention are not limited to laser diodes and may be used with many different types of laser emitters, including fiber lasers, individually packaged diode lasers, semiconductor lasers and other types of lasers. Furthermore, as used herein, the term "array" refers to one or more laser elements placed side by side. The array dimension in FIGS. 1A-C is along the slow axis for broad-area emitters; however, it is contemplated that individual emitters aligned along the array dimension may be along the fast axis, an angle off the slow axis or randomized with respect to each emitter along the array or row. As used herein, the term "stack" refers to two or more arrays stacked together. A stack can be arranged mechanically or optically. In one example, a mechanically arranged stack includes two or more arrays, which are physically stacked on top of one another to produce output beams, which are stacked on top of one another. An optically arranged stack can be achieved by using optics, such as turning mirrors, to arrange the output beams from two or more arrays, each beam from a corresponding array, such that the output beams are stacked on top of one another. The stacking dimension in FIGS. 1A-C is along the fast axis; however, it is contemplated that individual emitters aligned along the stacking or column dimension may be along the slow axis, an angle off the slow axis or randomized with respect to each emitter along the stack or column. The laser can be operated as a quasi-continuous wave (QCW) or CW with output power from sub-milliwatt to tens of Watts or higher.

As noted, Wavelength beam combining (WBC) of laser elements is an attractive method for scaling power and brightness from a laser system. Brightness is product of $N*P/(\lambda^2*M^2_x*M^2_y)$i, where N is the total number of combining elements, P is the output power of each element, and $\lambda$ is the operating wavelength, $M^2_x$, $M^2_y$ are the beam qualities along the two dimensions whereas $N*P$ is the power.

FIG. 1 shows three variations of WBC cavity using a common external partially reflecting coupler. 1) FIG. 1a illustrates wavelength-beam-combining of a one-dimensional array, where the beam combining is performed along the array dimension, which is also the slow dimension. The input 112 and output views 118 are shown on the left portion of FIG. 1A. The output beam is that of a single element. 2) FIG. 1B shows baseline cavity for wavelength-beam-combining along the array dimension, which is also the slow dimension. The result is a single column of beams. 3) FIG. 1C shows a third WBC external cavity. Wavelength-beam-combining is performed along the stacking dimension, which is also the fast dimension. This is opposite of the WBC dimension as shown in cavities 100a and 100b. The resulting output is an array of beams.

Generally, all three WBC cavities consist of an array or stack of laser elements, a transform optics (cylindrical or spherical lens or mirror), a dispersive element (shown using a diffraction grating), and a partially reflecting output coupler. The transform optic(s) is placed after the laser array. The position of the transform optics depends on the source. In an ideal point source it is placed a focal length away from the source. The dispersive element is placed at where all the beams are spatially overlapped, nominally at the back focal plane of the transform optics. If the dispersive element is not placed at the nominal position then results in degradation in output beam quality. The output coupler is placed on the path of the first-order diffracted beams. As such, ideally, all output beams from the laser elements are spatially overlapped at the grating by the transform optics as shown in FIGS. 1A-C. The partially reflective output coupler and grating provide feedback for unique wavelength control of the laser elements and overlap the beams in the near field (at the output coupler) and the far field. The result is, ideally, the output beam has the same beam quality as a single beam combining element but with the sum power from all the laser elements.

For scaling to higher power and higher brightness, this basic optical setup for the three WBC cavities discussed is limiting and at times impractical. To illustrate an example using the cavity shown in FIG. 1C is used. Assume that a 3000-watt WBC system is desired. Typical commercial-off-the-shelf (COTS) laser diode bars having multiple emitters are rated at 100 watts of total output power per bar. Thus, in order to achieve 3000 watts, 30 of these 100-watt laser diode bars are required. The pitch between diode bars of this type is typically approximately 2.0 mm. Thus, if 30 bars are stacked in a configuration like that in FIG. 1c, the width of the stack along the stacking dimension becomes 29×2=58 mm. The diameter of the transform optic required to receive the entire beam profile needs to be slightly larger so a standard size of 75 mm, or 3 inches would be an appropriate size. Optics with low aberrations are commercially available at this diameter but are more expensive and less common.

Scaling the previous illustration from a 3000-watt to a 10 kilowatt system would now require the size of the optic to be 3.3 times larger, or about 191.4 mm (~10 inches). Procuring a 10-inch diameter optics with low aberrations is very expensive and requires time-consuming custom optical fabrication. It makes a 10 kilowatt system not competitive in the market place. Additionally, assuming the spectral bandwidth of the 3000 W and 10 kW is the same, then the focal length of a 10-inch is also going to increase the distance between the transform optic/mirror to the diffraction grating by roughly a factor of 3.

Figure 2A:
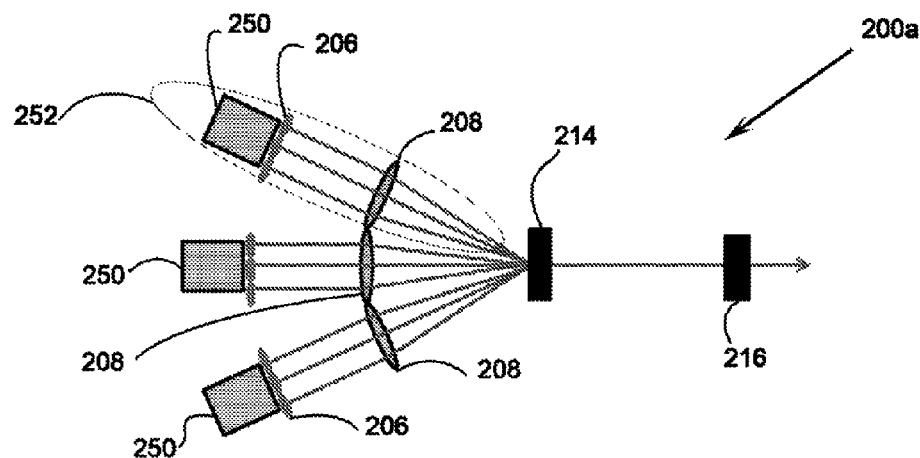
FIG. 2A is a schematic showing an embodiment for scaling a WBC system to tens of kilowatts or more.

One embodiment addressing the issue of using optical elements with larger apertures is illustrated in FIG. 2A. Here, an external cavity 200a, using a WBC method for scaling a plurality of emitters into a single output profile, is arranged using a plurality of smaller transform optics 208. By parsing stacks of emitters into individual modules with a smaller beam-input profile allows for optical elements with a smaller numerical aperture to be used. Additionally, the modularizing of the stacks allows for a system with greater flexibility. This flexibility includes the ability to replace one module at a time, adding additional modules to a system when increased power is required and other advantages that become apparent to one skilled in the art.

Cavity 200a consists of a plurality of laser elements 250 producing a one or two-dimensional profile, a transform optics for each set of laser elements 250, a dispersive element (shown transmission diffraction grating), and an output coupler. The individual laser input modules 252 of Cavity 200a are comprised of a set of plurality of laser elements 250, which forms a one or two-dimensional profile and a single transform optics 208. Additionally, as illustrated in FIG. 2A, a laser input module may include collimation optics, for example a fast-axis collimation optic or FAC optic, 206 configured to collimate the beams along the fast axis. Other optical elements may be included, but a basic laser input module includes at least two emitters and a single transform optics. Each set of laser emitters 250 and transform optic 208 are oriented such that all the beams from all the laser emitters are spatially overlapped on the diffraction grating 214. The transform optic of each stack may be placed a single focal length from the back-focal plane of the FAC optic 206. The diffraction grating 214 may be placed where all the beams are overlapped; nominally, this is at the focal plane of each of the transform optics 208. The output coupler 216 is generally placed in the path of the first-order diffracted beam. In this embodiment output coupler 216 may be partially reflective and when combined with the diffraction grating 214 provide feedback for unique wavelength control of the laser emitters. This is sometimes referred to as wave locking. In addition the grating and output coupler produce beam overlap both in the near field (at the output coupler) and in the far field, thereby forming a single output profile.

Continuing with the previous illustration of using laser diode bars where we assume the largest optical elements to be tolerated is 3 inches, then laser elements 250 would be comprised of a stack consisting of 30 diode bars. Thus each laser input module 252 would produce 3000 watts of total power and external cavity 200a as illustrated in FIG. 2A having three laser input modules would produce 9000 watts, assuming 100% efficiency. Adding a fourth or nth laser input module would increase the output of the external cavity by an additional 3000 watts.

Figure 2B:
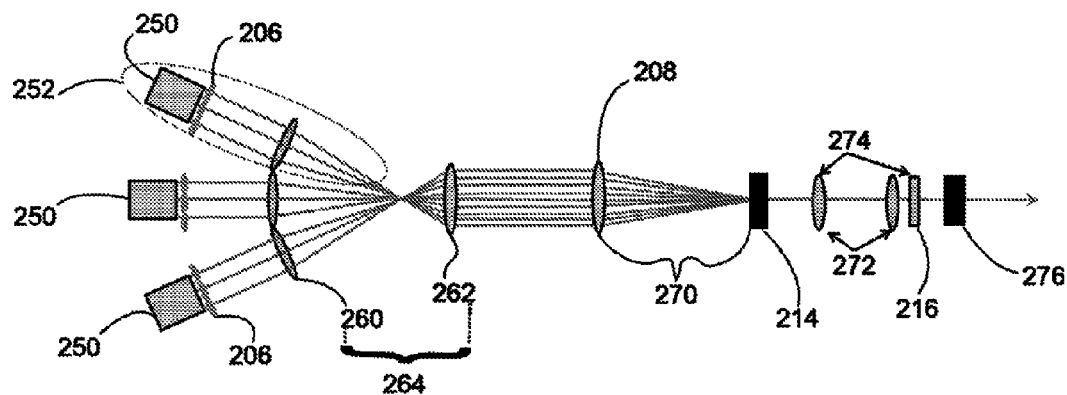
FIG. 2B is another schematic showing an embodiment for scaling a WBC system to tens of kilowatts or more, wherein telescoping optics have been incorporated.

Another implementation is shown in FIG. 2B. Some of the practical considerations when designing high power laser systems include: finite gain bandwidth of laser elements, acceptance angle of the dispersive element, spot size on dispersive element, and overall size of the system. External cavity 200b includes a secondary telescoping optic 262 configured to form a telescoping system 264 that reduces the aperture size of the overall profile as well as individual beams from each of the laser input modules 252. This reduction of the profile allows for transform optic 208 to have a smaller aperture, which in turn helps reduce the distance 270 between transform optic 208 and diffraction grating 214. The laser input modules 252 in external cavity 200b, as shown, consist of laser elements 250, FAC optic 206 and a primary telescoping optic 260, which when coupled with secondary telescoping optic 262 forms the telescoping system 264. Similarly to the embodiment in FIG. 2A, laser input modules 250 in FIG. 2B may include additional optical elements, but in base form require at least two laser emitters and an optical element configured to spatially reduce the distance between beams along at least one dimension. These optical elements in the base laser input module may include a cylindrical or spherical lens or mirror. The additional telescope helps alleviate most of these. The overall size is dictated by the focal length of the transforms optics. For example, using a 10-mm wide diode array at 976 nm with a f=100 mm transforms optics, and 1600 lines per mm grating results in a size, along one dimension, that is roughly 2 times the focal length of the transform optics or about 200 mm. However, using a f=10 mm and f=1 mm telescope, and f=10 mm transform optics results in a much smaller size of about 42 mm. The output beam characteristics are identical to a single f=100 mm transform optics. The spectral bandwidth of both cases is about 39 nm. 39 nm is about the gain bandwidth of the diode lasers at 976 nm. Thus adding more laser elements to the single-transform-optics cavity would not work. However, if in the second example, the transform optics is changed to f=20 mm the spectral bandwidth is reduced by 2× or for the same spectral bandwidth two 10-mm wide bar can be wavelength beam combined. This increased the overall size from roughly 42 mm to 62 mm. If the transform lens is changed to 100 mm the overall size is about 222 mm, comparable to the single transform optics design, but now 10 times more laser elements can be combined or roughly 10× brighter system.

The addition of the telescope also reduces the spot size on the grating. For example, a typical diode bar has a f=900 um collimation optic attached. Assuming ideal collimation the collimated beam has a divergence angle of about 1 mrad. Thus, using a f=100 mm transform optics the spot size on the grating is about 100 um along the WBC dimension. Such small spot size is not desired. The spot size on the grating is small and, thus, the power density on the grating would be very high. This results in increased risk of optical damage to the grating.

With the additional telescope the spot size on the grating can be increased by the telescope magnification. In the previous example using f=10 mm f=1 mm or 10× magnification the spot size on the grating is now 1 mm instead of 100 μm. At the same time the spectral bandwidth is reduced from 39 nm to 3.9 nm per bar. Thus, as stated earlier, 10 bars can be combined to use all of the 39 nm bandwidth. One example of as shown in FIG. 2B consists of multiple diode stacks, a telescope using an array of lenses and a common lens, a transform optic, a grating, a telescope along the WBC dimension, a telescope along the non-WBC dimension, and an output coupler. Along the WBC dimension, as shown in FIG. 2B, an array of lenses 260 and a common lens 262 form an array of telescopes 264. Each laser module has its own telescope. The laser modules and array of telescopes are positions such that all beams are nominally parallel to each other after the telescopes. Thus, its function is to reduce the size of each emitter and the overall size from all the laser modules to the appropriate desired size. The reduction in beam size after telescope will lead to larger beam size on the grating and thus lower the power density by the same factor. This reduction in stack size will result in better utilization of spectral bandwidth as shown in the above example. Thus, reduced images of the stacks are formed at the focal plane of the common optic of the telescope. The transform optic overlaps them onto the diffraction grating. The grating and output coupler force each laser bar to operate at a unique and controlled wavelength. In this manner, all the beams are spatially overlapped both in the near field and the far field. The telescope between the grating and output coupler is used to reduce the beam size along the beam combining dimension. Along the non-WBC dimension additional optics are needed such that all the beams along the non beam combining dimension are propagating normal to the output coupler. For example, as shown, the telescope along the non-WBC dimension between the grating and output coupler reimage the laser array onto the output coupler. In this way, the resultant output beam is the same as that of a single bar. It should be noted that an additional optics, not shown, may be needed to form a more robust and low loss cavity.

As a design example, we assume the lens array is a spherical lens is a 3-inch diameter optic with a focal length of 300 mm. The stack consists of 30 bars at 2 mm pitch. We assume that the common telescope optics is cylindrical optic has a focal length of 2.8 mm. We also assume that grating has a groove density of 1760 lines per mm. The transform optic has a focal length of 200 mm. Thus, the bandwidth of the laser stack is approximately 0.78 nm. For a ten 30-bar stacks the bandwidth is approximately 10×0.78/ff, where if is the stack-to-stack fill factor. For a stack-to-stack fill factor of 0.9, the bandwidth is approximately 8.7 nm. The beam size on the grating is approximately 100 mm. If a spatial inter-leaver is used with polarization multiplexing, up to 10 (the number of stacks)×30 (the number of bars per stack)×2 (the effect of the spatial inter-leaver)×2 (due to polarization)=1200 bars can be combined with an output beam quality of a single bar with bar power of 1200×100 W=120,000 W and spectral line width of approximately 8.7 nm.

Low-Cost, Highly Reliable, High-Brightness Diode Laser System

Highly reliable diode laser systems are in great demand for industrial applications. Industrial customers typically demand that the system last up to 100,000 hours, or more than 11 years. The lifetime of lasers varies by the laser type. The lifetime of actively cooled diode lasers using micro-channel coolers is approximately 10,000 hours or longer. Passively cooled diode lasers have a lifetime of approximately 20,000 hours or longer. The lifetime of sealed-tube CO2 lasers is approximately 35,000 hours. There is little maintenance. Sealed-tube CO2 lasers are limited to a few hundred Watts. High-power, kW-class CO2 laser systems typically last up to 100,000 hours or longer. However, they require maintenance every 1,000 hours and complete optical rebuild every 8,000 hours. Lamp-pumped solid state lasers have approximately the same cycle time as high power CO2 lasers. The lifetime of diode-pumped solid lasers, including fiber and bulk solid state, is much shorter than CO2 lasers. At best the lifetime is limited by the lifetime of the diode lasers. In this disclosure we show that the lifetime of our high-brightness WBC diode lasers can have a lifetime of up to 50,000 hours, 100,000 hours or greater without any need for maintenance.

FIG. 1 shows one fundamental wavelength beam combining (WBC) cavity. This cavity is based on our "New" WBC external cavity, which combines beams along a stacking dimension. Generally, each beam's fast axis is aligned with the stacking dimension. The WBC cavity includes the source diode laser stacks, which may be mechanically or optically stacked or a combination of mechanically and optically stacked. The external cavity also includes a transform optic, a grating, and an output coupler. After the output coupler, a beam shaper, fiber coupling optic, and output processing fiber is needed for beam delivery. Alternatively, free-space output is a possible beam delivery option. For the WBC cavity, it is possible to use a range of WBC cavities that we have invented, including "New" WBC, "Old" WBC, "New-New" WBC, and "New-Old" WBC, as well as a range of beam combination and brightness enhancing technologies for diode lasers that we have invented.

In most cases, the output power of diode lasers has a linear dependence on time and is approximately $$P(t) \approx P_0 - \beta t,$$

where $P_0$ is the initial power, $P(t)$ is the laser power at time t later, and $\beta$ is the degradation rate. For passively cooled diode bars the degradation rate is approximately $\beta \sim 1 \times 10^{-5}$ W per hour. Therefore, for passively cooled diode bars the end of life occurs at approximately 20,000 hours, where the end of life is defined as the time at which the output power is 80% of the initial value. To illustrate the intrinsic advantages of our system let us consider a 1,000-W system. Let us assume the cost of the diode laser is $10/W. Thus, for the 1,000-W system the cost of the diode is $10,000. We assume that our system may be required to last 100,000 hours. If we build our system with 1,000 W of diode lasers in the system we have to have to replace the diode lasers every 20,000 hours. Thus, we have to replace 4,000 W worth of diode lasers. The cost of the replacement is therefore $40,000 plus labor. All diode-pumped solid state lasers, including bulk Nd:YAG, thin disk, and fiber lasers, have to follow this model. This is fundamental of the laser resonator for diode-pumped solid state lasers. For example, in bulk Nd:YAG lasers, once the diode reaches its end of life condition, it has to replaced. It has to be replaced and the entire laser must be realigned optically. Fundamentally, this requirement may not apply to WBC systems. In our system the output beam is invariant with respect to the number of laser bars, the number of elements, or the output power of the system. For example, if we design a 1,000-W system we can install a multiplicity of 1,000 W diode laser groups in our system and just turn on one group at a time. At the end of 20,000 hours simply turn off the first group of diode lasers and turn on the second group or combination. Thus, replacement and/or realignment to the system are unnecessary. This is a fundamental property of our system. Intrinsic to our system, even though the diode lasers only last 20,000 hours we can make a laser system that lasts 100,000 hours, or any length of time desired. It is possible to reduce the number of replacement diode lasers required from the straightforward example described above. For example, when we manufacture the diode laser system, we install a total of 2,000 W worth of diode laser power. The 2,000-W laser would consist of 5 clusters of diode lasers. The first cluster has a power level of 1,200 W. The rest of the clusters are at 200 W each. For the first 20,000 hours we run just the 1200-W cluster until its end of life at the power level of 1000 W. At the end of 20,000 hours we run clusters 1 and clusters 2. At the end of 40,000 hours we run clusters 1, 2, and 3. At the end of 60,000 hours we run clusters 1, 2, 3, and 4. At the end of 80,000 hours we run all of the clusters. The output power from the system at any given time is always approximately at 1,000 W. In this example the total cost of the diode lasers is $20,000 instead of the previous example's $50,000 ($10,000 for the initial diodes plus $40,000 for the replacement diodes). More importantly there is no scheduled maintenance needed. We never have to open the sealed laser system to replace and realign the system. As part of the system, the cluster operation is programmed and controlled by a computer with a simple power threshold detector. If the diode lasers turn out to be more reliable than expected from the mean lifetime, the computer may not need to turn on additional clusters until the system power is lower than a pre-set threshold, which may further extend the operation time. The above example shows just one possible sequence of operating various clusters. A multiplicity of possible system scenarios exists. Furthermore, it is possible to combine this approach with de-rating the power from each cluster of diode lasers, which results in further, possibly drastic, improvements on the baseline lifetime expected for each cluster.

Single Frequency Diode Arrays and Stacks

The full utilization of diode bars and stacks in many applications, such as pumping of alkali lasers and spin-exchange optical pumping, is limited by the broad output spectrum. The output spectral bandwidth of diode bars and stacks is approximately 3 to 5 nm. For some applications output spectral bandwidth of less than 0.05 nm is required. Furthermore, the output spectrum is typically not wavelength-stabilized. Thus, the center wavelength changes as a function of operating temperature. In many applications this is not desirable and can lead to catastrophic damage of the laser system. The typical change of wavelength with temperature is about 0.33 nm per degree Celsius. In some applications, like pumping alkali lasers, a shift of about 0.05 nm will cause the laser system to stop lasing.

There are three general methods of line-narrowing and wavelength-stabilized diode arrays and stacks. First method uses an internal grating as part of the laser manufacturing process, for example, the distributed feedback (DFB) laser and distributed Bragg reflector (DBR) laser. Several companies offer internally wavelength stabilized diode arrays and stacks. A disadvantage of the first method is that diode laser performance typically suffers from the addition of an internal grating. The second method uses external volume Bragg gratings (VBG). There are various companies that offer VBGs. Both methods are time consuming and expensive. Furthermore, the resulting line width is about 0.5 nm with about 0.1 nm per degree Celsius wavelength-to-temperature coefficient. Typically, there is absorption in VBGs and thus sometime active cooling is required. The third method uses an external diffraction grating. The third method has the highest dispersion and, in principle, can result in very narrow line width.

Figure 3:
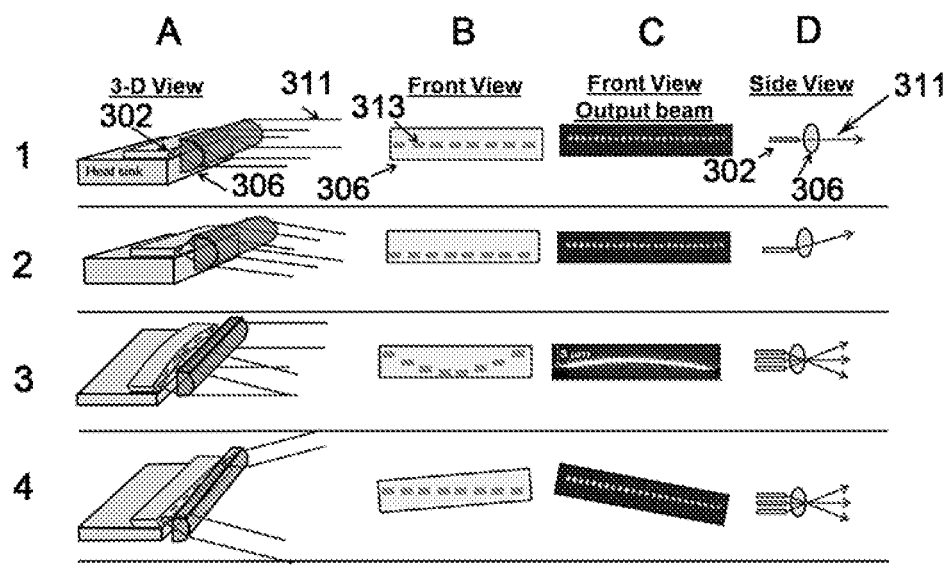
FIG. 3 illustrates common imperfections of various semiconductor, diode bar and other laser array emitters.

In methods 2 and 3 the resulting line width is much broader than that which the system is capable of. The broadening of the output spectrum is mainly due to imperfections in the laser emitters. Some of these imperfections apparent in laser diode bars are shown in FIG. 3. Row 1 of FIG. 3 shows a single laser diode bar 302 without any errors. The embodiments illustrated are exemplary of a diode bar mounted on a heat sink and collimated by a fast-axis collimation optic 306. Column A shows a perspective or 3-D view of the trajectory of the output beams 311 going through the collimation optic 306. Column D shows a side view of the trajectory of the emitted beams 311 passing through the collimation optic 306. Column B shows the front view of the laser facet with each individual laser element 313 with respect to the collimation optic 306. As illustrated in row 1, the laser elements 313 are perfectly straight. Additionally, the collimation optic 306 is centered with respect to all the laser elements 313. Column C shows the expected output beam from a system with this kind of input. Row 2 illustrates a diode laser array with pointing error. Shown by column B of row 2 the laser elements and collimation optic are slightly offset from each other. The result, as illustrated, is the emitted beams having an undesired trajectory that may result in reduced lasing efficiency for an external cavity. Additionally, the output profile may be offset to render the system ineffective or cause additional modifications. Row 3 shows an array with packaging error. The laser elements no longer sit on a straight line, and there is curvature of the bar. This is sometimes referred to as 'smile.' As shown on row 3, smile can introduce even more trajectory problems as there is no uniform path or direction common to the system. Column D of row 3 further illustrates beams 311 exiting at various angles. Row 4 illustrates a collimation lens unaligned with the laser elements in a twisted or angled manner. The result is probably the worst of all as the output beams generally have the most collimation or twisting errors. In most systems, the actual error in diode arrays and stacks is a combination of the errors in rows 2, 3, and 4. In both methods 2 and 3, using VBG's and diffraction gratings, laser elements with imperfections result in output beams no longer pointing parallel to the optical axis. These off optical axis beams result in each of the laser elements lasing at different wavelengths. The plurality of different wavelengths increases the output spectrum of the system to become broad as mentioned above.

Figure 4:
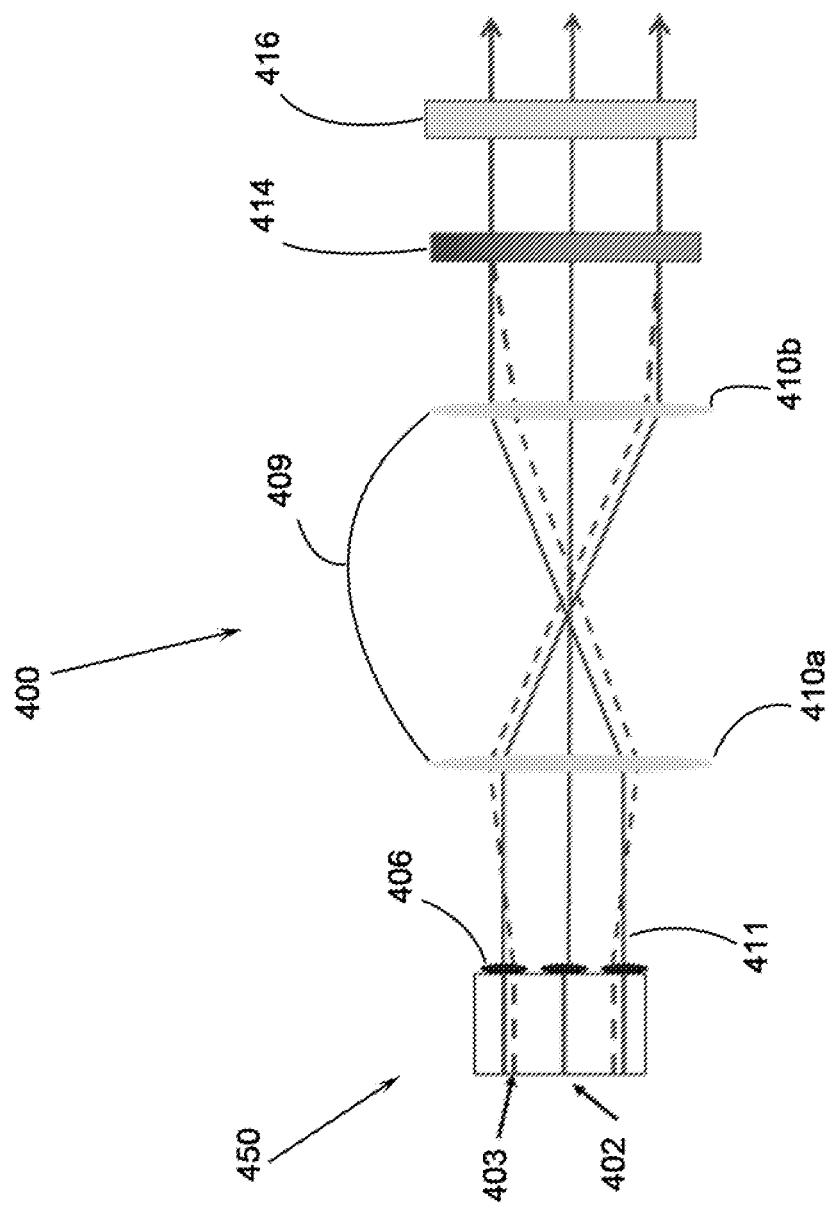
FIG. 4 illustrates a basic external cavity schematic to address smile and other pointing errors using a spherical telescope and diffraction grating for wavelength narrowing and stabilizing of diode arrays and stacks and improving beam quality of each diode bar simultaneously.

One attempt at addressing the imperfections presented in FIG. 3 is an external cavity 400 system illustrated in FIG. 4. 400 was designed using diffraction optic 414 for wavelength narrowing and stabilization of diode bars 402 and stacks of diode bars 450. The optics consists of a spherical telescope 409, diffraction grating 414, and output coupler 416. The diode arrays 402 and stacks 450 are placed at the sum of the focal plane of the first spherical lens 410a plus the focal length of the collimation optic 406. The separation between the two optics is the sum of their focal lengths. The grating 414 is placed at approximately the focal plane of the second spherical lens 410b. The output coupler 416 is placed at the output arm of the diffracting beam. In this arrangement, laser elements with any imperfections are pointing at different angles on the grating, which are indicated by the dashed lines. For example, consider the case in which a first diode array 403 in the stack 450 has smile. At the focal plane of the collimation optic, all the beams are spatially overlapped. The spherical telescope 410 takes the overlapped beam and positions it on the grating 414. The combination of the diffraction grating and the output coupler forces all the beams to propagate normal to the output coupler. The way it can accomplish this is that each laser element within a bar with imperfections is forced to operate at a unique wavelength that is dictated by the cavity. In other words, the output spectrum from each bar is broadened by the amount proportional to the imperfections.

An analysis (using ZEMAX) comparing the effects of smile on system 400 was produced. The model contained a three-bar diode stack. The center wavelength of each emitter had a wavelength of 980 nm. Each bar had 10 µm of smile, peak-to-valley. Each bar is collimated by an f=1 mm fast-axis collimation optic. The spherical telescope consists of two f=100 mm lenses. The grating has a groove density of 600 lines per mm. The top elements with +5 µm of smile are forced to operate at approximately 972.16 nm, and elements with −5 µm of smile are forced to operate at 987.82 nm. The elements without any smile operate at 980 nm. Therefore, the spectrum of each bar and the entire stack is now approximately 15.66 nm. Typically, single laser elements have a spectrum bandwidth of 3-5 nm. For state-of-the-art diode arrays and stacks the approximate range of smile is about 3 micron, which under this model would result in a spectral bandwidth of about 5 nm. Thus, this type of system for spectral brightness purposes may not be any better than the free-running spectrum.

Figure 5:
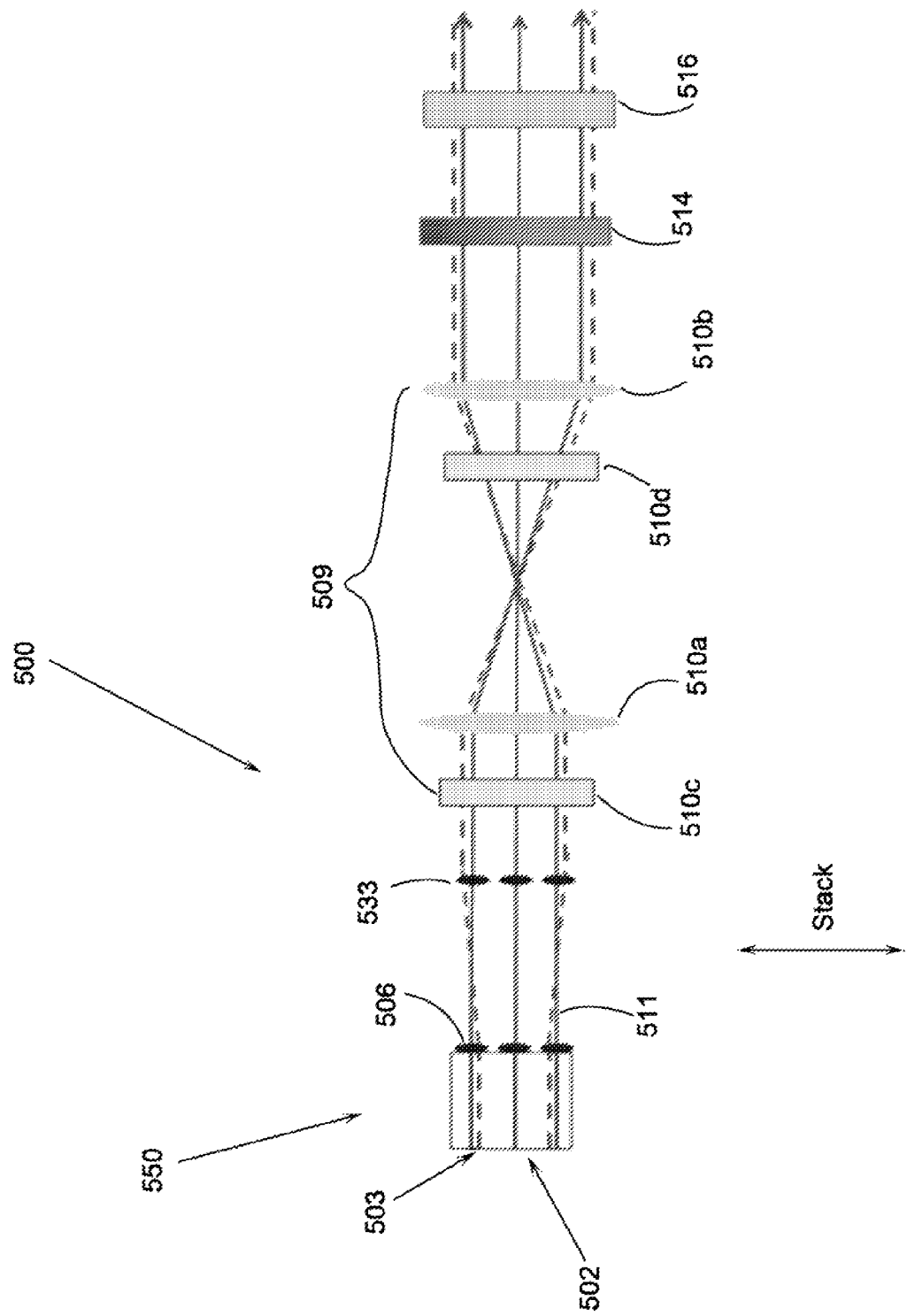
FIG. 5 illustrates a schematic where all laser elements are operating at the same narrowed wavelength, in some instances at a single frequency, independent of imperfections in diode bars and stacks.

FIG. 5 shows a new baseline cavity 500 using diffraction for wavelength narrowing and wavelength stabilization of diode arrays and stacks that is independent of imperfections The optical configuration consists of a cylindrical lens array 533 along the dispersion direction, two cylindrical telescopes 509, a diffraction grating 514, and an output coupler 516. The cylindrical lens array 533 has the same pitch as that of the diode stack 550. There are two cylindrical telescopes 509. The first cylindrical telescope (510c and 510d) is for imaging along the array dimension (coming out of the paper). The second cylindrical telescope (510a and 510b) is for imaging along the stacking dimension (vertical with the FIG. 5).

The cylindrical lens array 533 is placed at the sum of the focal plane of the cylindrical lens array and the focal length of the collimation optic 506. The diode stack 550 is also at the focal plane of the first optic 501c of the array-telescope. The output coupler is at the focal plane of the second optic of the array-telescope 510d. The separation is the sum of their focal lengths. Along the stack dimension, as shown in the FIG. 5, the first optic 510a of the stack-telescope is placed at the sum of the focal length of the cylindrical lens array 533 and focal length of the first optic 510a of the stack-telescope. The separation between the two optics of the stack-telescope is the sum of their focal lengths. The grating 514 is placed between the last optic 510b of the cylindrical telescope and output coupler 516. The output coupler 516 is placed at the output arm of the diffracting beam. In this arrangement, all elements with any imperfections are pointing at the same angle on the grating 514. Since all elements are pointing at the same angle, all of them will lase at exactly the same wavelength.

A ZEMAX model of this configuration was also analyzed. The parameters are the same as in the previous model with the inclusion of a cylindrical lens array 533. The cylindrical lens array has a focal length of 100 mm. All the elements operate at exactly the same wavelength. In principle, the output spectrum can be single frequency. This has many applications where a wavelength operating at MHz and kHz range requires high spectral brightness. This type of a system is also robust in that it becomes athermal or not susceptible to change in the lasing wavelength with increases or decreases in temperature.

Table 1 compares this optical cavity with competing techniques. The cavity setup in FIG. 5 is larger; however, it is universal in that it works for all diode laser bars and stacks. It works for perfect arrays as well as grossly imperfect arrays and stacks as previously described. The output spectrum produces a single frequency with tunable and athermal characteristics, which is highly desired in many applications.

TABLE 1

Comparison table between the approach as described in FIG. 5 and the competing approaches for wavelength stabilization and narrowing of diode laser bars and stacks.

| | Competitors | Embodiment of FIG. 5 |
|---|---|---|
| Optics | VBGs and internal grating | External cavity |
| Optics universal? | No | yes |
| Narrow line width | No | yes |
| Tunable wavelength | No | yes |
| Size | Compact | larger |

Utilizing Cylindrical Lens Arrays in a Wavelength Beam Combining (WBC) External-Cavity Along the Array Dimension of a Two-Dimensional Array of Diode Laser Elements The prior external-cavity 1-D wavelength beam combining (WBC) architecture, where WBC is performed along the array dimension, is shown in FIG. 1B. The cavity consists of a stack of laser elements with fast-axis collimation (FAC) lenses, a cylindrical transform lens/mirror, a diffraction element/grating, and a partially reflecting output coupler. The cylindrical transform lens/mirror is placed a focal length from the back focal plane of the FAC optics. The diffraction grating is placed at the back focal plane of the cylindrical transform optic. The output coupler is placed on the path of the first-order diffracted beam. As such the output beams from the laser elements are spatially overlapped at the grating by the transform optic. The reflective output coupler and grating provide feedback for unique wavelength control of the laser elements and overlap the beams in the near field (at the output coupler) and far field. WBC is performed along the array dimension. Stacking is for power scaling and not brightness scaling.

An analysis modeling FIG. 1B (using ZEMAX) assumes three diode bars with zero smile and no collimation errors. The FAC optic 106 has a focal length of 1 mm, which is typical of COTS FAC optics. The model consists of three diode bars 102 with FAC optics 106, a transform optic 108, a diffraction grating 114, and an output coupler 116. The transform optic 108 has a focal length of 100 mm. As can be seen from by the input and return beams are perfectly overlapped and, thus satisfy the requirements for a laser resonator.

Low smile and pointing errors of the collimated diode elements are two of the key characteristics that are highly desired for robust and efficient wavelength beam combining. Smile, or physical bending of the diode laser array during packaging, and pointing error caused by misalignment of collimating micro-lens degrade the output beam quality and reduce the beam combining efficiency. External-cavity operation is highly dependent on the amount of smile and collimation error. The prior WBC cavity as shown in FIG. 1B can tolerate only a very small amount of smile and collimation errors. The amount of error that the cavity can tolerate is an order of magnitude stricter than is possible with the current state-of-the-art.

The main drawback of the prior WBC cavity (FIG. 1B) is that the external-cavity is highly dependent on the amount of imperfections in diode arrays and stacks. Even the best diode arrays and stacks available today (with a smile of about 1 micron) are not good enough, as discussed performing a second optical model. This application discloses an embodiment of WBC architecture where external-cavity operation is independent of the amount of smile and collimation errors.

Figure 6:
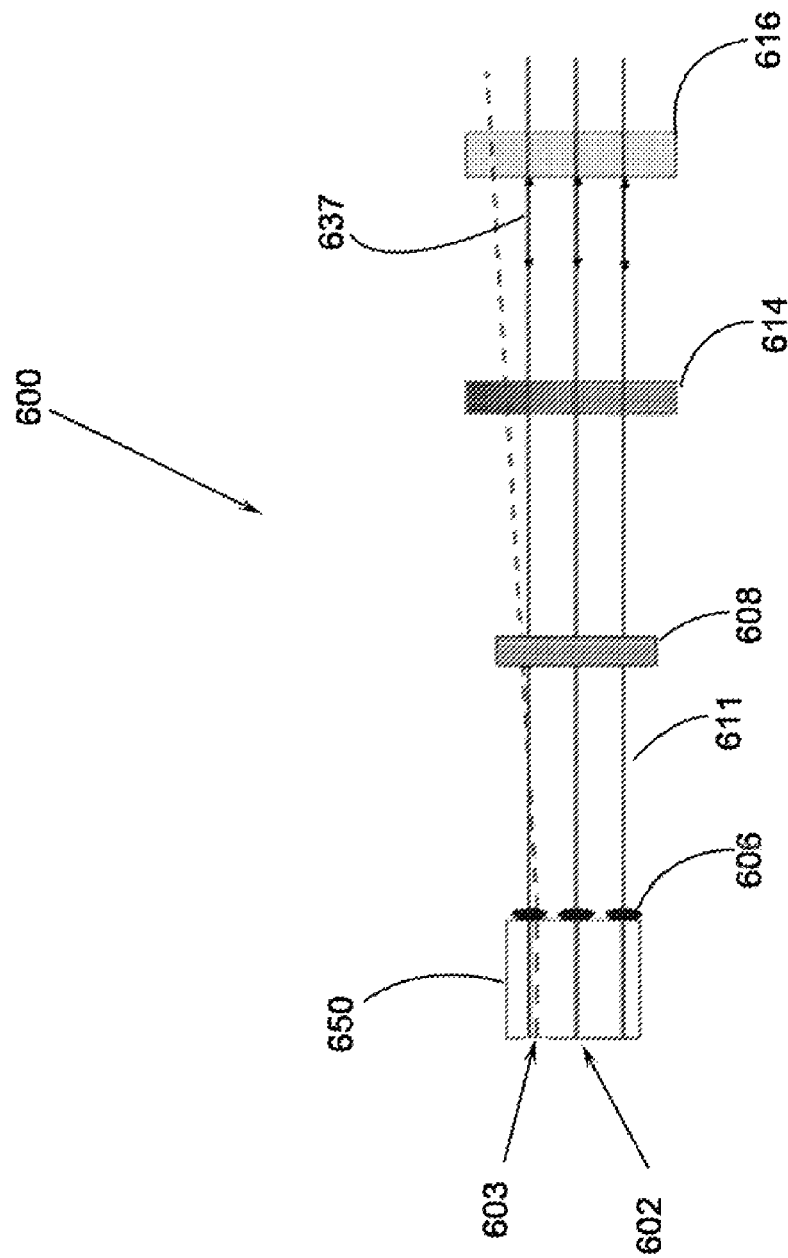
FIG. 6 illustrates a basic one-dimensional architecture of a diode laser stack with smile, where WBC is performed along the array dimension.

FIG. 6 shows the same WBC cavity as FIG. 1B, along the non-WBC dimension, with smile. The dashed line in FIG. 6 corresponds to elements 603 with smile. Due to smile, the return beam 637 from the output coupler 616 will not overlap with the incident beam. Thus, external-cavity operation is not possible.

A second optical model (using ZEMAX) based on FIG. 1B includes each bar having 2 microns peak-to-valley of smile. Additionally, three elements are modeled with zero, one, and minus microns of smile. The element with zero smile comes back onto itself perfectly. The element with 1 micron of smile misses the FAC optic (106 in FIG. 1B) altogether (the diameter of FAC optic is 1 mm) and thus external-cavity operation is not possible. The element with −1 micron of smile also misses the FAC optic.

Figure 7:
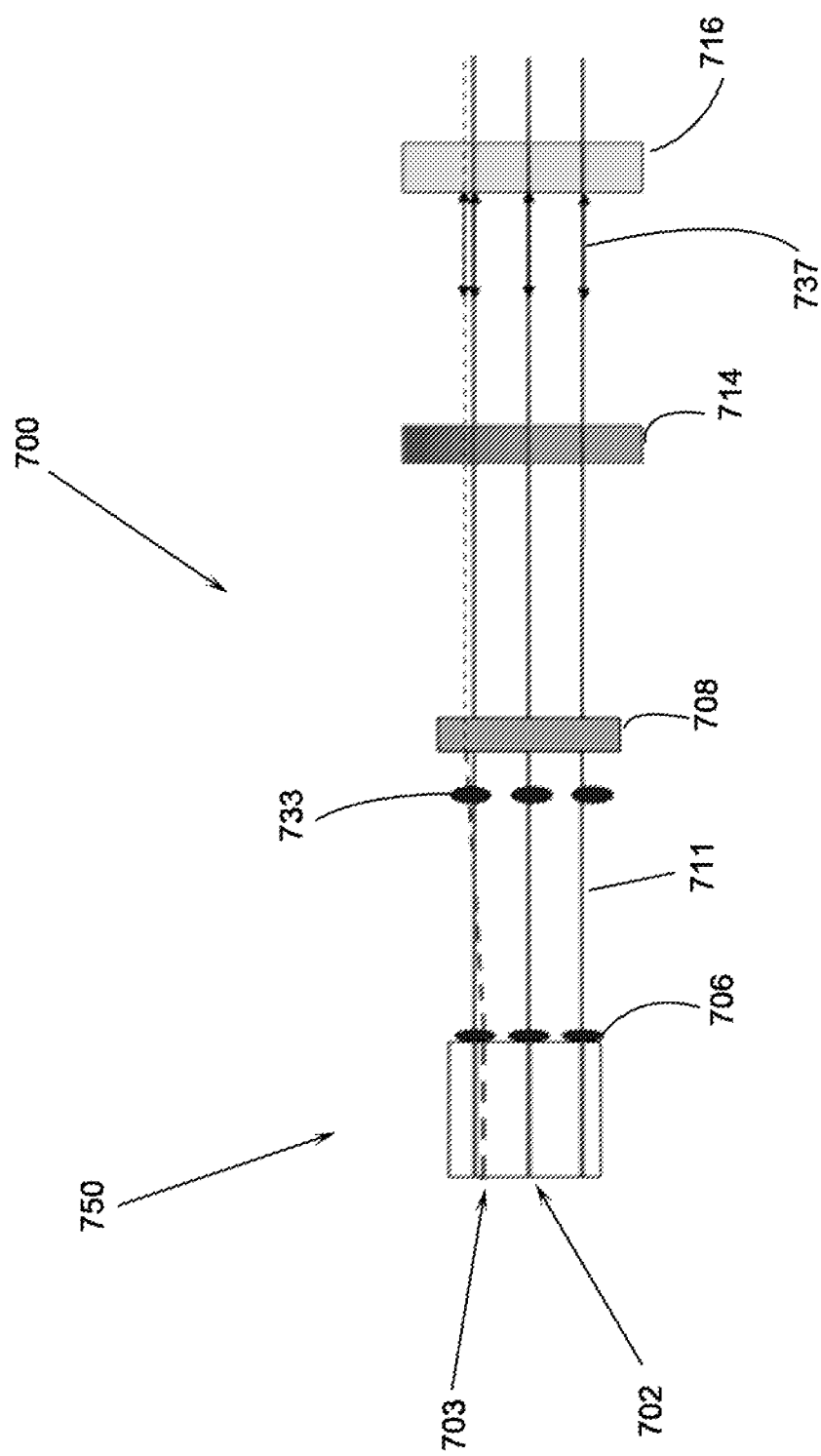
FIG. 7 illustrates the baseline architecture of a 1-D WBC of 2-D diode laser elements along the array dimension where imperfections are fully compensated by the cavity.

FIG. 7 shows the basic optical layout along the non-beam combining dimension. This cavity is designed to increase spatial brightness. The cavity 700 consists of a diode stack 750 with collimating optics 706, a cylindrical lens array 733, and an output coupler 716. The cylindrical transform optic 708 and grating 714 are along the beam-combining dimension. The cylindrical lens array 733 is placed a focal plane away from the back-focal plane of the collimating optics 706. The cylindrical lens array 733 has the same pitch as the pitch of the diode stack 750. The diode stack 750 and grating 714 are placed at the focal plane of the cylindrical transform optic 708. In such cavity external-cavity is independent of any imperfections in diode bars and stacks.

Modeling FIG. 7 (using ZEMAX) of cavity 700 includes the parameters of diode bar 703 exhibiting 20 microns of smile (peak to valley) with a FAC optic 706. Notice this is 10 times more smile then previously discussed in the second optical model of FIG. 1B. Here the cylindrical lens array 733 has a focal length of 100 mm. The results conclude that return beams 737 overlap with the incident beams, which allows for external cavity operation free and independent from smile and collimation errors. Laser cavities with this type of design have many applications in the high power laser cutting industry, as well as other areas.

External-Cavity One-Dimensional (1-D) Wavelength-Beam-Combining (WBC) of 2-D Diode Laser Elements Independent of Diode Array and Stack Imperfections Prior external-cavity 1-D WBC architecture of 2-D laser elements as related art is shown in FIG. 1C where beam combining is performed along the stacking dimension. The cavity consists of 2-D diode laser elements or diode laser stack with fast-axis collimation (FAC) optics, a cylindrical transform lens/mirror, a diffraction element/grating (with dispersion along fast-axis or stack dimension), and a partially reflecting output coupler. The transform lens/mirror is placed a focal length from the back-focal plane of the FAC optic. The diffraction grating is placed at the focal plane of the transform optic. The output coupler is placed on the path of the first-order diffracted beam. As such, ideally, all output beams from the laser elements are spatially overlapped at the grating by the transform optic as shown in FIG. 1C. The reflective output coupler and grating provide feedback for unique wavelength control of the laser elements and overlap the beams in the near field (at the output coupler) and the far field. WBC is performed along the stacking dimension, which is also primarily the fast axis dimension for each beam. The array dimension is used for power scaling and not brightness scaling. External-cavity operation is independent of smile, pointing error, or FAC twisting errors as indicated in FIG. 3. To reduce diffraction loss a cylindrical telescope along the array dimension images each emitter along the array dimension or slow-axis on the output coupler. Along this dimension, the cylindrical telescope and diffraction grating do nothing.

Optically modeling FIG. 1C (using ZEMAX) shows that from a diode stack the output beam will be a single diffraction-limited beam. For purposes of the model it is assumed three diode bars have zero smile and no collimation errors. The FAC optic 106 has focal length of 1 mm which is typical of COTS FAC optics. The transform optic 108 has a focal length of 100 mm. We assume all the optical components are ideal (for concept demonstration only). We did not include the output coupler 116 in the model. In addition, at the focal plane of the transform optic or at the diffraction grating all the beams are perfectly overlapped. Since all the beams from all the elements are spatially overlapped on the diffraction grating, the output beam will be a single diffraction-limited beam when operated in cavity.

Figure 12:
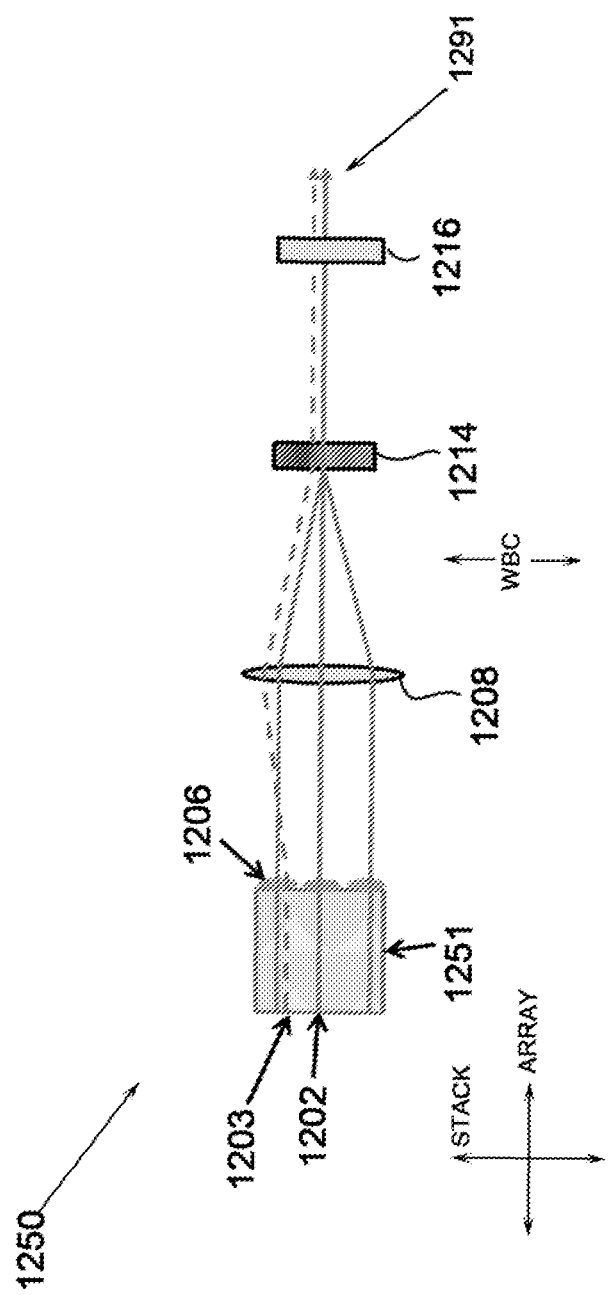
FIG. 12 illustrates a cavity system having smile.

FIG. 12 shows the same WBC cavity, along the WBC dimension, with smile, except for the cylindrical lens telescope of 109a and 109b. The cylindrical telescope is not of concern since it is along the non-beam combining direction. The dashed line in FIG. 12 corresponds to elements 1203 with smile. When modeling FIG. 12 the parameters used were the same as for the previous modeling of FIG. 1C, except that each bar has 20 microns from peak-to-valley of smile. Elements with smile 1203 or collimation errors are not spatially overlapped at the diffraction grating 1214 as shown in FIG. 12. These elements, however, will still operate in the external cavity due to the function of the grating 1214 and output coupler 1216. However, there will be degradation in the output beam coupler. The output beam will be no longer a single beam as shown by the output profile 1291. All elements within a given bar including elements with smile will lase at nominally the same wavelength. Since there is a one-to-one correspondence between position and spectrum, this results in the broadening of the beam size after the output coupler. However, the effective feedback for all the elements with smile or collimation errors is essentially 100% and is independent on the amount of smile or any collimation errors.

The main drawback of this WBC cavity is that the output beam quality will degrade proportionally to the amount imperfections in diode bars and stack (smile and collimation errors). These errors can degrade the output beam quality by as much as a factor of 10. While diode bars and stacks with low smile and collimation errors are available (typically leading to a 2× to 3× degradation in output beam quality) they tend to be more expensive. In this application, an embodiment of a new WBC architecture is described where the output beam quality along the beam combining dimension is nearly diffraction-limited and independent of the amount of smile and collimation error.

Figure 8:
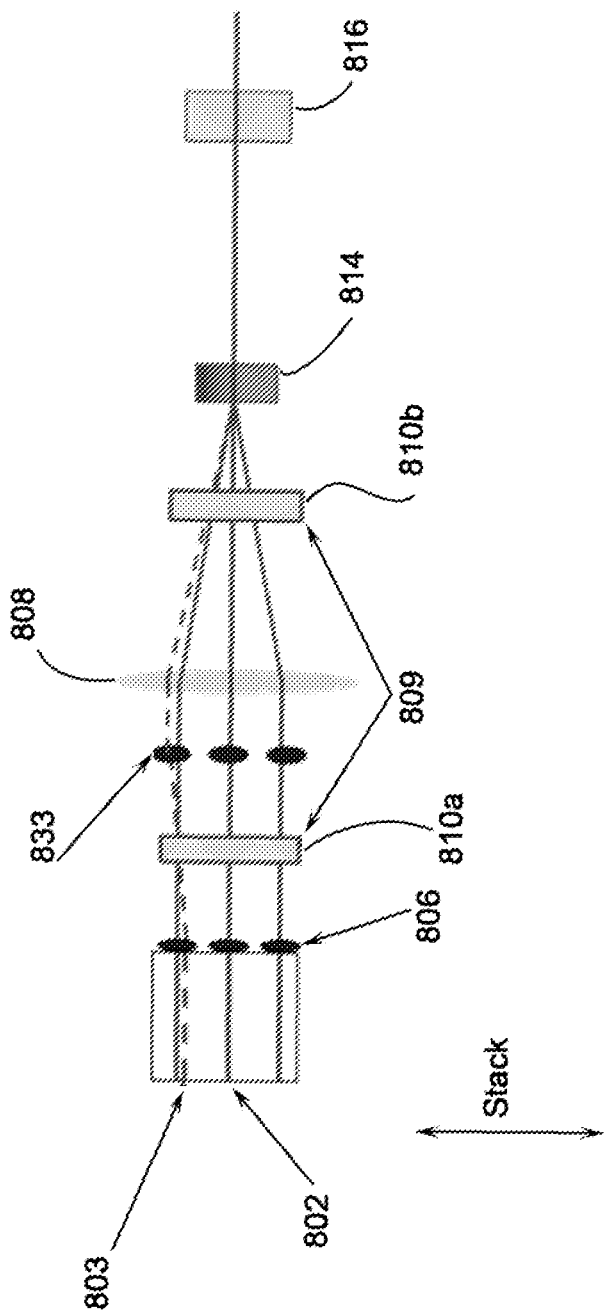
FIG. 8 illustrates the baseline architecture of a 1-D WBC cavity combining along the stack dimension that produces ideal or nearly ideal beams independent of any imperfections in diode bars and stacks.

FIG. 8 shows this basic optical layout. The cavity consists of a diode stack 850 with FAC optics 806, a cylindrical lens array 833, a cylindrical transform optic 808, a grating 814 (with dispersion along the stacking dimension), and an output coupler 816. A cylindrical telescope 809 along the array or non-beam combining dimension is used to image the array onto the output coupler 816. The cylindrical lens array 833 is placed a focal plane away from the back-focal plane of the FAC optics 806. The cylindrical lens array has the same pitch as the pitch of the diode stack 850. The transform optic 808 is placed a focal length from the back-focal plane of the cylindrical lens array 833. The grating 814 is placed at the back focal plane of the transform optic 808.

Figure 13:
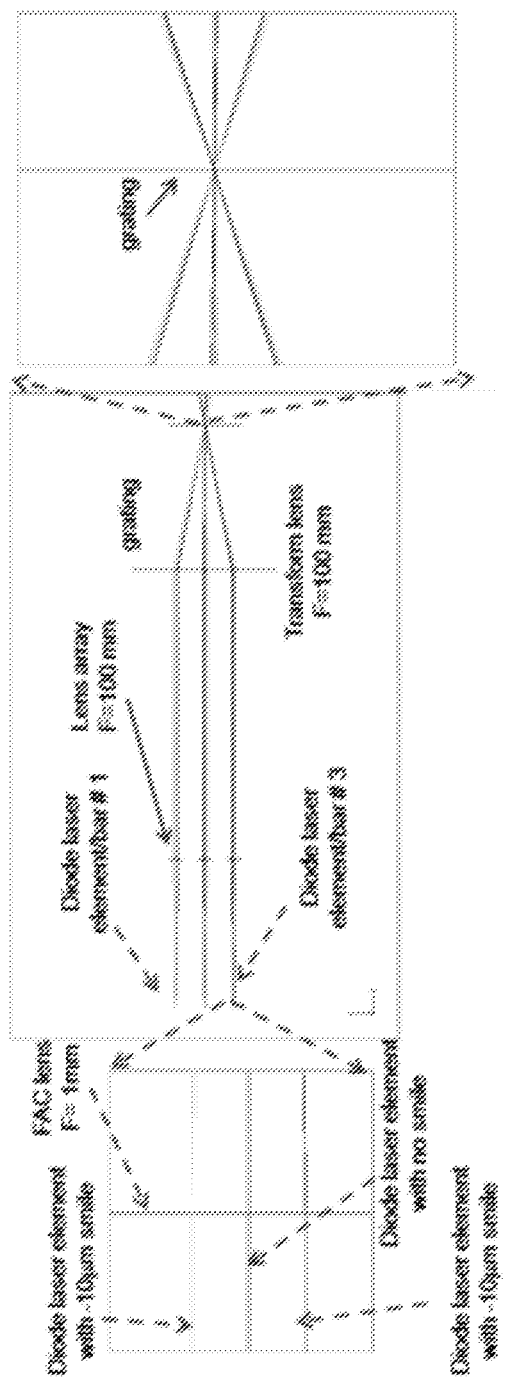
FIG. 13 is a computational optical model of a configuration of the embodiment in FIG. 8.

FIG. 13 shows a ZEMAX model of this diffraction limited output profile along the beam combining dimension WBC cavity. The left portion of FIG. 13 shows a diode bar with 20 microns of smile (peak to valley) with a FAC optic. The middle portion of FIG. 13 shows part of the cavity. Both the cylindrical transform optic and cylindrical lens array have a 100-mm focal length. The right portion of FIG. 13 shows all the beams spatially overlapped onto the diffraction grating. Since all the beams from all the elements, regardless of smile or collimation error, are spatially overlapped on the diffraction grating, the output beam will be a single diffraction-limited beam when operated in the cavity.

Diode Array and Stack Beam Error Correction

The full utilization of diode bars and stacks in many applications, such as pumping of solid state lasers and direct use in material processing, is limited by the poor output beam. Furthermore, the output beam quality of diode arrays and stacks is much worse than what is actually possible, with respect to the beam quality of each individual emitter. The degradation is mainly due to packaging and collimation errors. These errors are shown in FIG. 3 and described above.

Figure 9:
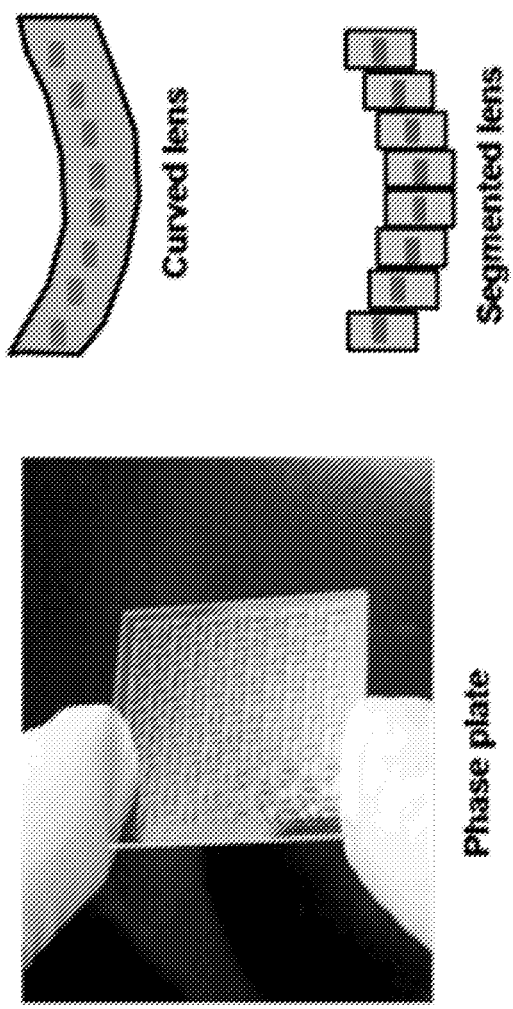
FIG. 9 illustrates related art methods used for correcting imperfections in diode arrays and stacks.
Figure 10:
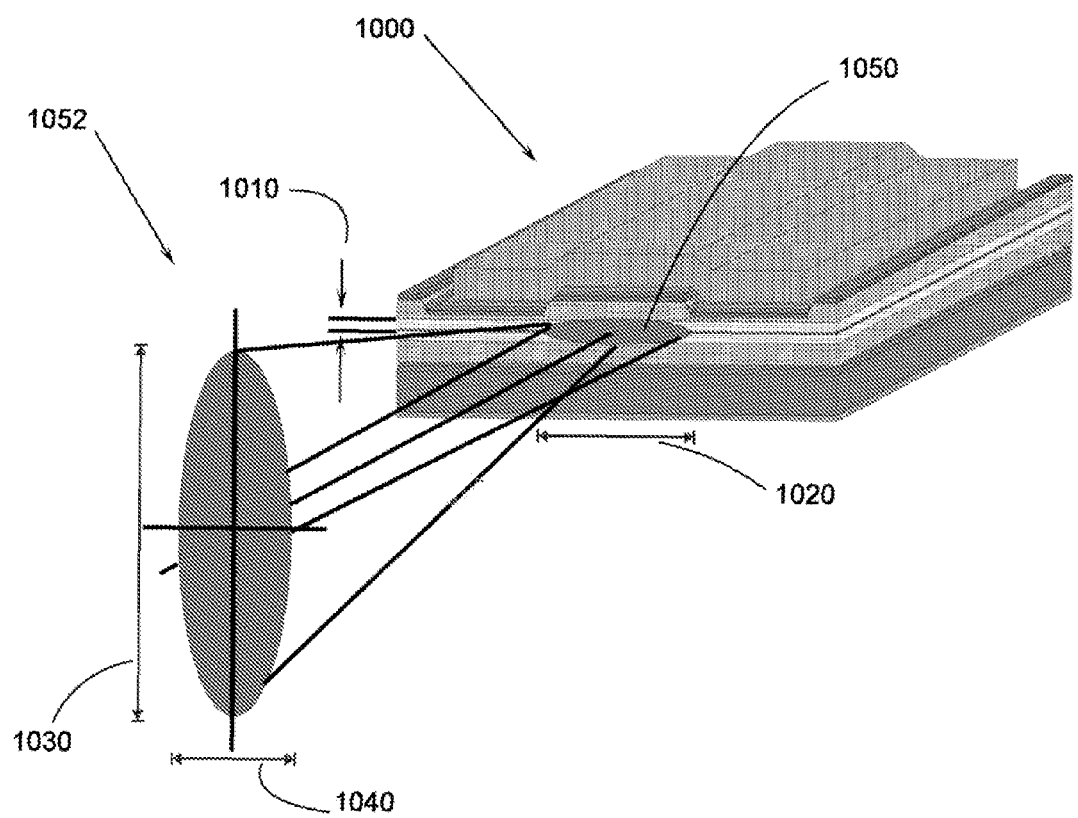
FIG. 10 illustrates an asymmetric beam's divergence.

FIG. 9 shows some related art of common methods used for correcting the imperfections in diode arrays and stacks. The left-hand portion of FIG. 9 shows a commercial product from Power Photonic (http://www.powerphotonic.co.uk/). The product is a piece of glass with phase variation. The phase plate can correct for most imperfections. The right-hand portion of FIG. 9 shows two types of shaped optics for correcting smile. The shaped optic cannot correct pointing and twisting errors. The three methods shown are highly customized. The imperfections of each diode array and stack need to be measured precisely. Once the imperfections are known then a phase plate or shaped lens are custom fabricated. The phase plate or shaped lens cannot be used for another array or stack.

Figure 11:
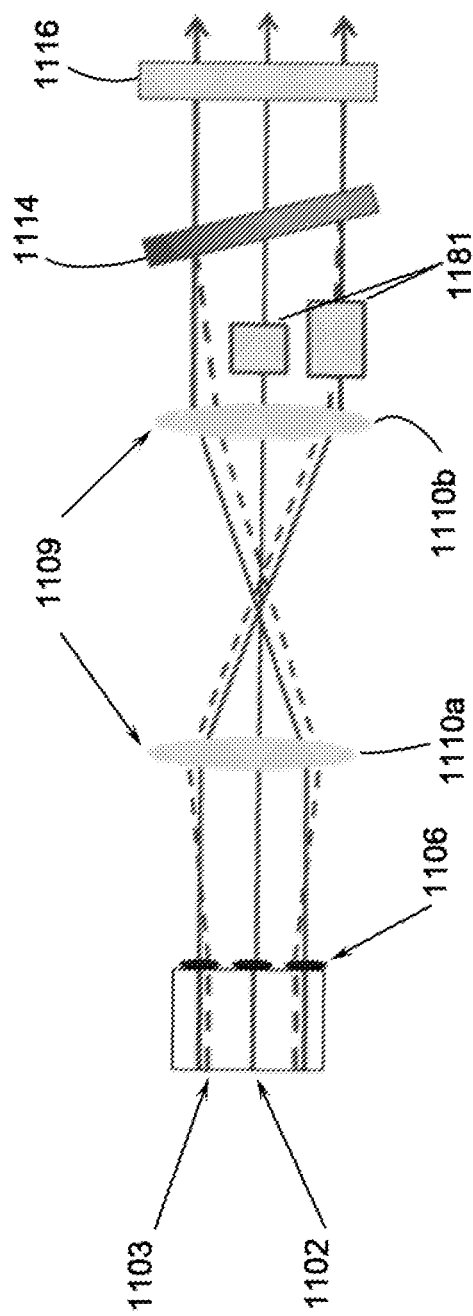
FIG. 11 illustrates a diffraction cavity system using glass blocks in order to reduce imperfections.

FIG. 11 shows another embodiment of a baseline optical setup for correcting most imperfections in diode arrays and stacks. The optical configuration consists of a spherical telescope 1109, glass blocks 1181, a grating 1114, and an output coupler 1116. Another possible configuration consist of two cylindrical telescopes. The telescope along the dispersion dimension overlaps all the beams within a given bar onto a diffraction grating. The telescope along the non beam combining dimension image each emitter onto the partially reflecting mirror. The diode arrays 1102 and 1103 are placed at the sum of the focal plane of the first spherical lens 1110a plus the focal length of the collimation lens 1106. The separation between the two lenses is the sum of their focal lengths. The grating 1114 is placed at the focal plane of the second spherical optic 1110b. Since the grating 1114 is positioned at an angle off the optical axis, an array of glass blocks is required. The output coupler 1116 is placed at the output arm of the diffracting beam. In this arrangement, any imperfections in the diode arrays and stacks are fully corrected for. For example, consider the case that first diode array 1103 has smile. At the focal plane of the collimation optic all of the beams are spatially overlapped. The spherical telescope 1109 takes the overlapped beam and positions it on the grating 1114. The combination of the diffraction grating 1114 and the output coupler 1116 force all of the beams to propagate normal to the output coupler 1116. Thus, the output beam is just a single beam. The only way that this condition can be realized is that each laser element within a bar with imperfections is forced to operate at a unique wavelength dictated by the cavity.

Modeling a configuration of the concept and nature of FIG. 11 includes using a three-bar diode stack, operating at a wavelength of 980 nm and no imperfections. Each bar is collimated by an f=1 mm fast-axis collimation optic. The spherical telescope consists of two f=100 mm optics. The grating is 600 lines per mm. As expected, the output beam from the cavity is the same as the input beam. When modeling the same cavity but with imperfections in diode arrays, such as the top and bottom arrays have 100 μm peak-to-valley of smile, which is about a fifty-fold higher smile than that in state-of-the-art diode bars and stacks, the middle bar has 50 mrad of pointing error. This is about 25-fold more pointing error than that in the state-of-the-art diode bars and stacks. Even with this large magnitude of smile and pointing errors, the resultant beam is identical that of the first model, where there are no smile and pointing errors. To accomplish this, for example, elements in the top and bottom bars with 50 μm smile operate at 901.08 nm, while the element in the top and bottom bars with −50 μm operate at 1057.5 nm. The elements without any smile operate at 980 nm. The middle bar with 50 mrad of pointing error operates at 901.08 nm. It should be mentioned that this is an extreme example, illustrating the power of this technique for bar and stack error compensation. In practice, state-of-the-art bar smile is in the range of 2 micrometers, and the resultant line-width in a practical correction cavity is on the order of 0.5 nm. This more practical example illustrates the narrow-bandwidth capability of the technique. Using this embodiment described herein, regardless of smile, pointing, or twisting errors, the output beam quality is fully compensated and the same as that of a single element.

Table 1 compares our optical cavity with competitors. The only disadvantage in our setup is that it is larger. Our setup can fully compensate for smile, pointing, and twisting errors. Our setup is universal. The setup, in principle, works for all lasers. There is no need to measure the imperfections of the diode laser bars and stacks and fabricate a custom correction optic. Our approach works for perfect arrays and stacks to grossly imperfect arrays and stacks. Since our setup requires a diffraction grating, the output spectrum will be narrow linewidth, tunable, and athermal. These characteristics are highly desirable in many applications.

TABLE 1

Comparison table of diode bar and stack correction methods.

|  | Related Art | Embodiment of FIG. 11 |
|---|---|---|
| Optics | Phase plate, shaped optics | External cavity |
| Smile correction | Not fully | yes |
| Pointing error | Not fully | yes |
| Collimation error | Not fully | yes |
| Optics universal | No | yes |
| Narrow line-width | No | yes |
| Tunable wavelength | No | yes |
| Improve output beam quality | Yes | yes |
| Size | Compact | larger |

The above description is merely illustrative. Having thus described several aspects of at least one embodiment of this invention including the preferred embodiments, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A scalable wavelength beam combiner system comprising:
   a plurality of modular laser input devices, wherein each modular laser input device includes:
      at least one beam emitter configured to produce an electromagnetic beam, and
      at least one transform optic, wherein each transform optic causes the emitted beams to overlap at a dispersive element, and wherein the dispersive element transmits the overlapped beams as a single output profile; and
   a partially-reflecting output coupler arranged to receive the combined beams from the dispersive element, to reflect a portion of the combined beams toward the dispersive element, and to transmit the combined beams as a multi-wavelength beam comprising optical radiation having a plurality of wavelengths.

2. A scalable wavelength beam combiner system comprising:
   a plurality of modular laser input devices, wherein each modular laser input device includes:
      one or more beam emitters each configured to produce an electromagnetic beam, and at least one primary telescoping optic configured to receive the beams;

a secondary telescoping optic aligned to form a telescoping system with each of the primary telescoping optics, wherein the telescoping system aligns the beams parallel to each other;

a transform optic configured to receive the parallel beams and combine the parallel beams along a beam combining dimension;

a dispersive element positioned at a region of overlap of the combined beams to receive and transmit the beams; and a partially-reflecting output coupler arranged to receive the combined beams from the dispersive element, to reflect a portion of the combined beams toward the dispersive element, and to transmit the combined beams as a multi-wavelength beam comprising optical radiation having a plurality of wavelengths.

3. The system of claim 2, wherein the transform optic has a diameter less than or equal to five inches.

4. The system of claim 2, wherein the transform optic is a curved mirror with a diameter less than or equal to five inches.

5. A method for scaling a WBC system comprising the steps of:

arranging a plurality of transform optics to each receive and overlap at least one emitted electromagnetic beam onto a dispersive element;

reflecting a portion of the overlapped beams back towards the dispersive element; and transmitting a single output profile from the overlapped beams.

6. A method for a scaling an external cavity WBC system comprising the steps of:

receiving emitted electromagnetic beams from modules of one or more beam emitters into an optical telescoping system having more than one input surface, wherein the telescoping system has an input surface for each module;

aligning all the received beams parallel to each other;

combining the parallel beams onto a dispersive element;

reflecting a portion of the combined beams back into the beam emitters; and transmitting a single output profile from the dispersive element.

* * * * *